US012787442B2

(12) United States Patent
Chang

(10) Patent No.: US 12,787,442 B2
(45) Date of Patent: Nov. 3, 2026

(54) GATE ALL-AROUND (GAA) FIELD EFFECT TRANSISTORS (FETS) FORMED ON BOTH SIDES OF A SUBSTRATE

(71) Applicant: Marvell Asia Pte Ltd, Singapore (SG)

(72) Inventor: Runzi Chang, Saratoga, CA (US)

(73) Assignee: Marvell Asia Pte Ltd, Singapore (SG)

( * ) Notice: Subject to any disclaimer, the term of this patent is extended or adjusted under 35 U.S.C. 154(b) by 560 days.

(21) Appl. No.: 18/454,835

(22) Filed: Aug. 24, 2023

(65) Prior Publication Data

US 2024/0072070 A1 Feb. 29, 2024

Related U.S. Application Data

(60) Provisional application No. 63/401,730, filed on Aug. 29, 2022.

(51) Int. Cl.
*H10D 86/60* (2025.01)
*H10D 84/03* (2025.01)
(Continued)

(52) U.S. Cl.
CPC ........... *H10D 86/60* (2025.01); *H10D 84/038* (2025.01); *H10D 84/83* (2025.01); *H10D 86/01* (2025.01);
(Continued)

(58) Field of Classification Search
CPC ...... H10D 86/60; H10D 86/01; H10D 86/441; H10D 86/201; H10D 84/038; H10D 84/83;
(Continued)

(56) References Cited

U.S. PATENT DOCUMENTS

2017/0271477 A1 9/2017 Palle et al.
2018/0175034 A1* 6/2018 Goktepeli ............ H10D 84/853
(Continued)

FOREIGN PATENT DOCUMENTS

CN 114914239 A 8/2022

OTHER PUBLICATIONS

Applied Materials, Inc., "Atomic Layer Deposition (ALD)," Product Information, pp. 1-7, year 2023, as downloaded from https://www.appliedmaterials.com/us/en/semiconductor/products/processes/ald.html.
(Continued)

*Primary Examiner* — Dao H Nguyen
(74) *Attorney, Agent, or Firm* — Meitar Patents LTD.; Daniel Kligler

(57) ABSTRACT

An electronic device includes a substrate, first and second semiconductor devices, and a power supply structure. The first semiconductor device includes a first plurality of gate all-around (GAA) field effect transistors (FETs) formed over a first side of the substrate. The second semiconductor device includes a second plurality of GAA FETs formed over a second side of the substrate, opposite the first side. The power supply structure is (a) disposed at the first side, and (b) configured to supply power to one or more of: (i) the first plurality of GAA FETs through first electrical couplings disposed at the first side, and (ii) the second plurality of GAA FETs through second electrical couplings including one or more inter-side vias (ISVs) traversing the substrate from the second side to the first side.

20 Claims, 4 Drawing Sheets

(51) Int. Cl.

| | |
|---|---|
| ***H10D 84/83*** | (2025.01) |
| ***H10D 86/01*** | (2026.01) |
| ***H10D 86/40*** | (2025.01) |
| ***H10D 88/00*** | (2026.01) |
| ***H10W 20/00*** | (2026.01) |
| ***H10W 20/20*** | (2026.01) |
| ***H10W 20/42*** | (2026.01) |

(52) U.S. Cl.
CPC ........... *H10D 86/441* (2025.01); *H10D 88/01* (2025.01); *H10W 20/023* (2026.01); *H10W 20/20* (2026.01); *H10W 20/42* (2026.01)

(58) Field of Classification Search
CPC ............... H10D 84/85; H10D 84/0149; H10D 84/0186; H10D 84/834; H10D 88/01; H10D 88/101; H10D 30/6757; H10D 30/014; H10D 30/43; H10D 30/6735; H10W 20/023; H10W 20/20; H10W 20/42; H10W 20/0245; H10W 20/427
See application file for complete search history.

(56) References Cited

U.S. PATENT DOCUMENTS

| | | | | |
|---|---|---|---|---|
| 2022/0122892 | A1* | 4/2022 | Smith | H10D 84/038 |
| 2022/0336325 | A1* | 10/2022 | Lai | H10W 20/069 |
| 2023/0253324 | A1* | 8/2023 | Hong | H10W 20/427<br>257/777 |
| 2023/0395608 | A1* | 12/2023 | Or-Bach | H10D 87/00 |
| 2024/0008285 | A1* | 1/2024 | Sharma | H10D 30/0415 |
| 2024/0072070 | A1* | 2/2024 | Chang | H10D 86/60 |

OTHER PUBLICATIONS

Applied Materials, Inc., "AKT-PECVD System for Amorphous Silicon Application," Product Information, pp. 1-3, year 2023, as downloaded from https://www.appliedmaterials.com/il/en/product-library/akt-pecvd-system-for-amorphous-silicon-application.html.

ASML, "Twinscan NXE:3600D—EUV lithography systems," Product Information, p. 1, years 2019-2023, as downloaded from https://www.lamresearch.com/product/vector-product-family/.

ASML, "Twinscan NXT:2050i—DUV lithography machines," Product Information, ages 1-2, years 2019-2023, as downloaded from https://www.asml.com/en/products/duv-lithography-systems/twinscan-nxt2050i.

Lam Research Corporation, "Vector Product Family," Product Information, pp. 1-2, year 2023.

Nikon Corporation, "Immersion lithography technology supports leading-edge semiconductor production," Product Information, pp. 1-2, year 2023, as downloaded from https://www.nikon.com/business/semi/technology/story04.html.

Tokyo Electron Ltd., "Tactras™ Series," Product Information, pp. 1-3, years 1996-2023, as downloaded from https://www.tel.com/product/tactras.html.

Applied Materials, Inc., "Centura® Etch," Product Information, pp. 1-2, year 2023, as downloaded from https://www.appliedmaterials.com/us/en/semiconductor/products/processes/etch/centura-etch.html.

Lam Resesearch Corporation, "Technology: Atomic Layer Etch (ALE)," Product Information, p. 1, year 2023, as downloaded from https://www.lamresearch.com/technology/atomic-layer-etch-ale/.

Lam Resesearch Corporation, "Selective Etch Product Family," Product Information, p. 1, year 2023, as downloaded from https://www.lamresearch.com/product/selective-etch-product-family/.

Tokyo Electron Ltd., "Episode™ UL Series," Product Information, pp. 1-3, years 1996-2023, as downloaded from https://www.tel.com/product/episode_ul.html.

International Application # PCT/IB2023/058399 Search Report Dec. 4, 2023.

* cited by examiner

GATE ALL-AROUND (GAA) FIELD EFFECT TRANSISTORS (FETS) FORMED ON BOTH SIDES OF A SUBSTRATE

CROSS-REFERENCE TO RELATED APPLICATIONS

This application claims the benefit of U.S. Provisional Patent Application 63/401,730, filed Aug. 29, 2022, whose disclosure is incorporated herein by reference.

FIELD OF THE DISCLOSURE

The present invention relates generally to electronic devices, and particularly to electronic devices having gate all-around (GAA) field effect transistors (FETs) on both sides of a substrate, and fabrication methods thereof.

BACKGROUND

Electronic devices, such as ultra large-scale integrated circuits (ULSI) devices, have field effect transistors (FETs), such as metal-oxide semiconductor (MOS) FET, Fin FET, and gate all-around (GAA) FETs, fabricated on a single side of a semiconductor substrate. All FETs require a channel (whose functionality is described below) formed in a semiconductor layer. It is noted in MOS FET and Fin FET require the channel is implemented in the semiconductor substrate, and therefore, are conventionally limited to being formed on one side of the semiconductor substrate. The scaling of ULSIs devices typically requires the formation of over ten levels of (i) electrically conductive power rails patterned and stacked on top of one another for exchanging electrical signals with the FETs, and (ii) one or more dielectric layers formed between each pair of the power rails. The large number of power rail levels increases the electrical resistance of the ULSI device, and results in increased voltage drop within the ULSI device, and increased power consumption by the ULSI device. Moreover, forming the FETs on one side of the substrate reduces the rate of scaling the number of FETs in a ULSI device.

The description above is presented as a general overview of related art in this field and should not be construed as an admission that any of the information it contains constitutes prior art against the present patent application.

SUMMARY

An embodiment of the present invention that is described herein provides an electronic device including a substrate, first and second semiconductor devices, and a power supply structure. The first semiconductor device includes a first plurality of gate all-around (GAA) field effect transistors (FETs) formed over a first side of the substrate. The second semiconductor device includes a second plurality of GAA FETs formed over a second side of the substrate, opposite the first side. The power supply structure is disposed at the first side, and the power supply structure is configured to supply power to one or more of: (i) the first plurality of GAA FETs through first electrical couplings disposed at the first side, and (ii) the second plurality of GAA FETs through second electrical couplings including one or more inter-side vias (ISVs) traversing the substrate from the second side to the first side.

In some embodiments, at least a given ISV among the ISVs includes an electrically conductive interconnect, the electrically conductive interconnect being formed within the given ISV and being configured to conduct an electrical signal between the first and second semiconductor devices. In other embodiments, at least one of the power supply structure, the first semiconductor device, and the second semiconductor device is configured to conduct, through the given ISV, at least one of: (i) a data signal, (ii) a power signal, and (iii) a ground signal. In yet other embodiments, the electronic device includes an additional power supply structure disposed at the second side, the additional power supply structure being configured to supply power to one or more of: (i) the second plurality of GAA FETs through the second electrical couplings disposed at the second side, and (ii) the first plurality of GAA FETs through the first electrical couplings and at least the one or more ISVs of the second electrical couplings.

In some embodiments, the first semiconductor device includes a first type of semiconductor device, and the second semiconductor device includes a second type of semiconductor device. In other embodiments, the first and second types of semiconductor devices include a same type of semiconductor device. In yet other embodiments, the first and second types of semiconductor devices include different types of semiconductor devices.

In some embodiments, the substrate includes a non-conductive substrate. In other embodiments, the non-conductive substrate includes a ceramic substrate. In yet other embodiments, the non-conductive substrate includes a polymer substrate.

There is additionally provided, in accordance with an embodiment of the present invention, a method for fabricating an electronic device, the method including forming, on a first side of a substrate, a first semiconductor device including a first plurality of gate all-around (GAA) field effect transistors (FETs). A second semiconductor device including a second plurality of GAA FETs is formed on a second side of the substrate that is opposite the first side. A power supply structure is disposed at the first side for supplying power to one or more of: (i) the first plurality of GAA FETs through first electrical couplings disposed at the first side, and (ii) the second plurality of GAA FETs through second electrical couplings including one or more inter-side vias (ISVs) traversing the substrate from the second side to the first side.

The present disclosure will be more fully understood from the following detailed description of the embodiments thereof, taken together with the drawings in which:

DETAILED DESCRIPTION OF EMBODIMENTS

Figure 1:
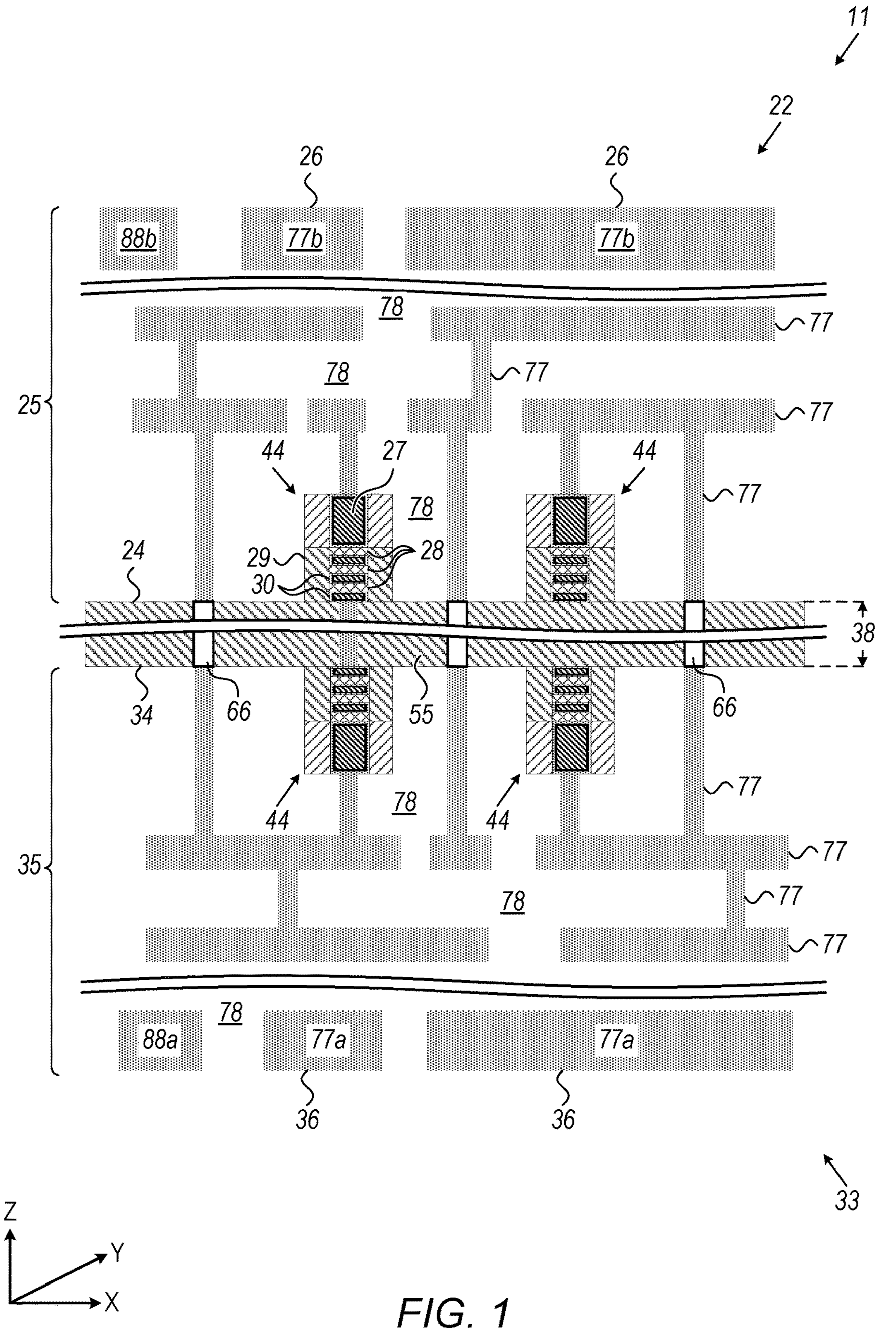
FIG. 1 is a schematic, sectional view of an electronic device, in accordance with an embodiment that is described herein.

Semiconductor devices typically comprise field-effect transistors (FETs) formed over a substrate and used for processing data, and for managing operations in the device, such as (i) reading, writing, and refreshing memory, and (ii) on/off switching employed in the operation of logic circuits.

The number of FETs is a key factor for determining the performance of a semiconductor device. It is noted that the total area of the device is limited, and therefore, continuous miniaturization (also referred to herein as scaling) of the FETs is essential for improving the performance and increasing the functionality of FET-based semiconductor devices. Each FET comprises a gate electrode, and source and drain. The gate controls the mobility of charge carriers, e.g., electrons or holes, between the source and the drain. When charge carriers pass between the source and the drain, the FET is in an opened position, and when the charge carriers do not pass between the source and the drain, the FET is in a closed position.

In order to enable the scaling, chip designers have altered the structure of the FET from a two-dimensional (2D) metal-oxide semiconductor (MOS) FET to a three-dimensional (3D) fin FET, and subsequently, to a 3D gate all-around (GAA) FET. The substrate has first and second opposite surfaces. In MOS FET the charge carriers move through the substrate, so the quality of the substrate, and particularly the first surface of the substrate, is a critical enabler for proper functioning of the FET. The second surface of the substrate typically is clamped during fabrication to equipment, used for fabricating the MOS FET, for instance to a chuck. Because of possible damage resulting from the clamping, the second surface is not suitable to accommodate functional FETs. The GAA FET comprises a gate electrode that is disposed orthogonally to the substrate and that defines a channel length of the FET. In a typical implementation, the gate electrode has multiple openings, and multiple nanowires or nanosheets, each of which is disposed parallel to the substrate and is orthogonal to the gate, and traverses through a respective opening in the gate. In GAA FET the channel is fabricated by forming one or more suitable layers surrounding each of the nanowires or nanosheets, and the mobility of the charge carriers through the channel is determined as a function of the power signals applied to the GAA FET. The transition in industry to the use of GAA FET structures enables further miniaturization of the channel length that in turn improves the electrical performance, however this further miniaturization increases the complexity and the costs associated with the fabrication of the GAA FET-based devices.

Embodiments described in the present disclosure provide an electronic device having one or more semiconductor devices fabricated on both sides of a substrate. In the present example, a first semiconductor device is fabricated on a first side of the substrate, and a second semiconductor device is fabricated on a second side of the substrate, opposite the first side. As will be described in detail below, in GAA FET the channel is implemented in one or more layers that are not within the substrate, and are formed over the outer surface of the substrate. As such, damage that may occur on the surface of the substrate during the fabrication process, e.g., by the aforementioned chuck, does not prevent the formation of GAA FETs on this surface, as will be described below. In some embodiments, both the first and second semiconductor devices comprise first, and second pluralities of GAA FETs formed on the first and second sides of the substrate, respectively. More specifically, a gate electrode is formed orthogonally to the substrate, and the nanosheets or nanowires are formed through openings in the gate electrode, as described above.

In some embodiments, the channels of the GAA FETs are implemented in one or more layers that are formed not within the substrate, in other words, the channel is implemented in one or more layers formed on top of the outer surfaces of the substrate. For example, the channel is implemented by disposing one or more epitaxial layers surrounding the nanosheets or nanowires, as will be depicted in detail in FIG. 1 below. In such embodiments, GAA FETs could be formed on both sides of the substrate, because the quality of the substrate (e.g., number of defects, and surface planarity) is less critical for the mobility of the charge carriers through the channel. The first and second semiconductor devices comprise first and second electrical couplings, respectively. The electrical couplings are configured to conduct electrical signals (e.g., data signals, power signals, and ground signals) to and from each of the first and second pluralities of GAA FETs, respectively. In the present example, the electrical couplings are implemented in multiple (e.g., over ten) layers of metal traces patterned between and through dielectric layers formed over the GAA FETs. In the context of the present disclosure and in the claims, the term "side" refers to any position between the outer surface of the substrate (having the GAA FETs formed thereon) and the outer surface of the outer layer of the electrical couplings, as will be shown and depicted in more detail in FIG. 1 below.

In some embodiments, the electronic device further comprises one or more inter-side vias (ISVs) traversing between the outer surfaces of the substrate. The ISVs are configured to conduct electrical signals between the first and second semiconductor devices formed on the first and second sides of the substrate, respectively.

In some embodiments, the electronic device comprises a power supply structure disposed at the first side of the substrate. The power supply structure may be implemented within or over an outer layer of the electrical couplings, or at any other suitable position between the outer surface of the substrate and the outer layer of the electrical couplings.

In some embodiments, the power supply structure is configured to supply power to one or more of: (i) the first plurality of GAA FETs through the first electrical couplings, and (ii) the second plurality of GAA FETs through the second electrical couplings, and via the one or more ISVs traversing the substrate as described above.

In other embodiments, an additional power supply structure is disposed at the second side of the substrate for supplying power to one or both of the first and second semiconductor devices. Moreover, other configurations of the electronic device are depicted in FIG. 1 below.

In some embodiments, the first semiconductor device is fabricated on the first surface of the substrate, and a passivation layer is formed over the outer layer of the first electrical couplings. Subsequently, a carrier is coupled (e.g., bonded) to the passivation layer, and the substrate is thinned to a suitable thickness between about 100 nm and 500 nm (e.g., by etching and/or polishing the second side of the substrate). Subsequently, the second semiconductor device is fabricated on the second surface of the substrate, and finally, the carrier and the passivation layer are removed from the first side. It is noted that the ISVs may be formed during fabrication of either the first semiconductor device or the second semiconductor device. The fabrication process is depicted in detail in FIGS. 2A, 2B and 3 below.

The description above is presented as a general overview of embodiments of the present disclosure, which are described in detail herein.

FIG. 1 is a schematic, sectional view of an electronic device 11, in accordance with an embodiment that is described herein. Electronic device 11 is also referred to herein as a device 11, for brevity.

In some embodiments, device 11 comprises a substrate 55 having a first surface referred to herein as a surface 24, and a second surface referred to herein as a surface 34, which is opposite the surface 24. Surfaces 24 and 34 are coplanar with an XY plane of an XYZ coordinate system of device 11.

In some embodiments, substrate 55 is made from silicon or any other suitable semiconductor substance. In alternative embodiments, substrate 55 is made from any suitable type of non-conductive substrate, such as but not limited to: (i) a ceramic substrate (e.g., crystalized silicon dioxide, glass, or another suitable ceramic material), or (ii) a non-conductive polymer having sufficient stiffness for fabricating semiconductor devices thereon. Substrate 55 may have a suitable thickness, referred to herein as a thickness 38, e.g., between about 100 nm and 500 nm, along a Z-axis of the XYZ coordinate system. The thickness of substrate 55 depends on the application and the specification of device 11.

In some embodiments, device 11 comprises (i) a first semiconductor device, referred to herein as a device 22, which is formed over surface 24, and (ii) a second semiconductor device, referred to herein as a device 33, which is formed over surface 34. In the present example, both devices 22 and 33 comprise first and second pluralities of gate all-around (GAA) field effect transistors (FETs) 44. Each GAA FET 44 comprises a gate electrode, referred to herein as a gate 27, source and drain (SD) 29 formed at the sides of gate 27. Each GAA FET 44 further comprises one or more nanosheets (NSs) 28 formed within one or more respective openings in gate 27, and epitaxial layers 30 surrounding each of NSs 28 within the openings of gate 27. Epitaxial layers 30 serve as the channel of GAA FET 44. Based on power schemes applied to GAA FET 44, epitaxial layers 30 are configured to enable and disable the mobility of charge carriers (electrons or holes) along the channel, so as to set the respective open and close positions (also referred to herein as states) of each FET.

In some embodiments, both semiconductor devices 22 and 33 comprise electrical couplings (ECs) 77 configured to conduct electrical signals within semiconductor devices 22 and 33. The electrical signals may comprise power and ground, also referred to herein as power signals and ground signals. In the present example, the power is conducted between power supply structures 88 (described in detail below) and GAA FETs 44, so as to set the position of each GAA FET 44 as described above. Each of semiconductor devices 22 and 33 comprises one or more grounding points, at least one of the grounding points is electrically coupled to the respective power supply structure 88, so as to close the power-ground electrical circuit. Moreover, in an embodiment, the electrical signals comprise data signals conducted over ECs 77.

In some embodiments, ECs 77 are implemented in: (i) multiple (in an embodiment over ten) layers of electrically conductive traces formed in XY planes of the XYZ coordinate system, and (ii) vias formed along the Z-axis (of the XYZ coordinate system) for electrically coupling between the traces. The traces and vias of ECs 77 are typically made from copper or from any other suitable electrically conductive material. Moreover, each of devices 22 and 33 comprises dielectric layers 78 that are formed between ECs 77 and are configured to electrically insulate between different electrical signals conducted by ECs 77.

In some embodiments, electronic device 11 comprises at least one power supply structures 88 configured to supply power to one or both semiconductor devices 22 and 33. In the present example, semiconductor devices 22 and 33 comprise power supply structures 88*b* and 88*a*, respectively, which are disposed at sides 25 and 35 of semiconductor devices 22 and 33, respectively. In the context of the present disclosure and in the claims, the term "side" refers to any position between the outer surface of the substrate and the outer layer of ECs 77. In the present example, side 25 of device 22 is defined between surface 24 of substrate 55, and a surface 26 of a layer 77*b*, which is the outermost layer of the ECs 77 of device 22. As such, power supply structure 88*b* is implemented as a pattern within layer 77*b*. Moreover, side 35 of device 33 is defined between surface 34 of substrate 55, and a surface 36 of a layer 77*a*, which is the outer layer of the ECs 77 of device 33. In the present example, power supply structure 88*a* is implemented as a pattern within layer 77*a*.

In other embodiments, at least one of power supply structures 88, may be implemented in a pad formed over the outermost surface of the outermost layer of the respective side. For example, power supply structure 88*a* may be implemented in an electrically conducive pad (not shown) formed on surface 36 of layer 77*b*. In alternative embodiments, power supply structure 88 may be implemented at any other suitable position within at least one of sides 25 and 35 of electronic device 11.

In some embodiments, electronic device 11 comprises one or more inter-side vias (ISVs) 66 traversing between surfaces 24 and 34 of substrate 55. At least one of, and typically each ISV 66 comprises an electrically conductive (e.g., copper) interconnect, which is formed within the ISV 66, and is configured to conduct one or more electrical signals between semiconductor devices 22 and 33.

In some embodiments, device 11 may comprise a single power supply structure 88. For example, device 11 comprises only power supply structure 88*a* of device 33, whereas power supply structure 88*b* is omitted from the configuration of device 22. In such embodiments, power supply structure 88*a* is configured to supply power to one or both of: (i) the first plurality of GAA FETs 44 of semiconductor device 33, through the ECs 77 of semiconductor device 33, and (ii) the second plurality of GAA FETs 44 of semiconductor device 22, through the ECs 77 of semiconductor device 22, and via one or more of ISVs 66 traversing substrate 55.

In other embodiments, power supply structure 88*b* is disposed at side 25 of substrate 55 (as shown and depicted above), so as to supply power to one or both of semiconductor devices 22 and 33 using ECs 77 and ISVs 66, as described above for the power supplied by power supply structure 88*a*.

The configuration of electronic device 11 is provided by way of example, in order to illustrate certain problems that are addressed by embodiments of the present invention and to demonstrate the application of these embodiments in enhancing the performance of such a device. Embodiments of the present invention, however, are by no means limited to this specific sort of example device, and the principles described herein similarly may be applied to other sorts of electronic devices.

In the present example, electronic device 11 comprises a single semiconductor device, e.g., a processor whose structures and functionalities are partitioned between devices 22 and 33. In alternative embodiments electronic device 11 may comprise (i) different types of semiconductor devices, such as a processor at side 25 and a memory device (e.g., a static random access memory (SRAM), a dynamic RAM (DRAM), or a flash memory) at side 35, (ii) different products of the same type of device, such as first and second processors fabricated in sides 25 and 35, respectively, by using the same technology node but having different layouts, and (iii) same two products (e.g., processors) formed on sides 25 and 35. Moreover, ISVs 66 may be omitted from one or more of the above configuration of device 11, for example, in case there is no need to conduct any sort of signals between semiconductor devices 22 and 33.

Figure 2A:
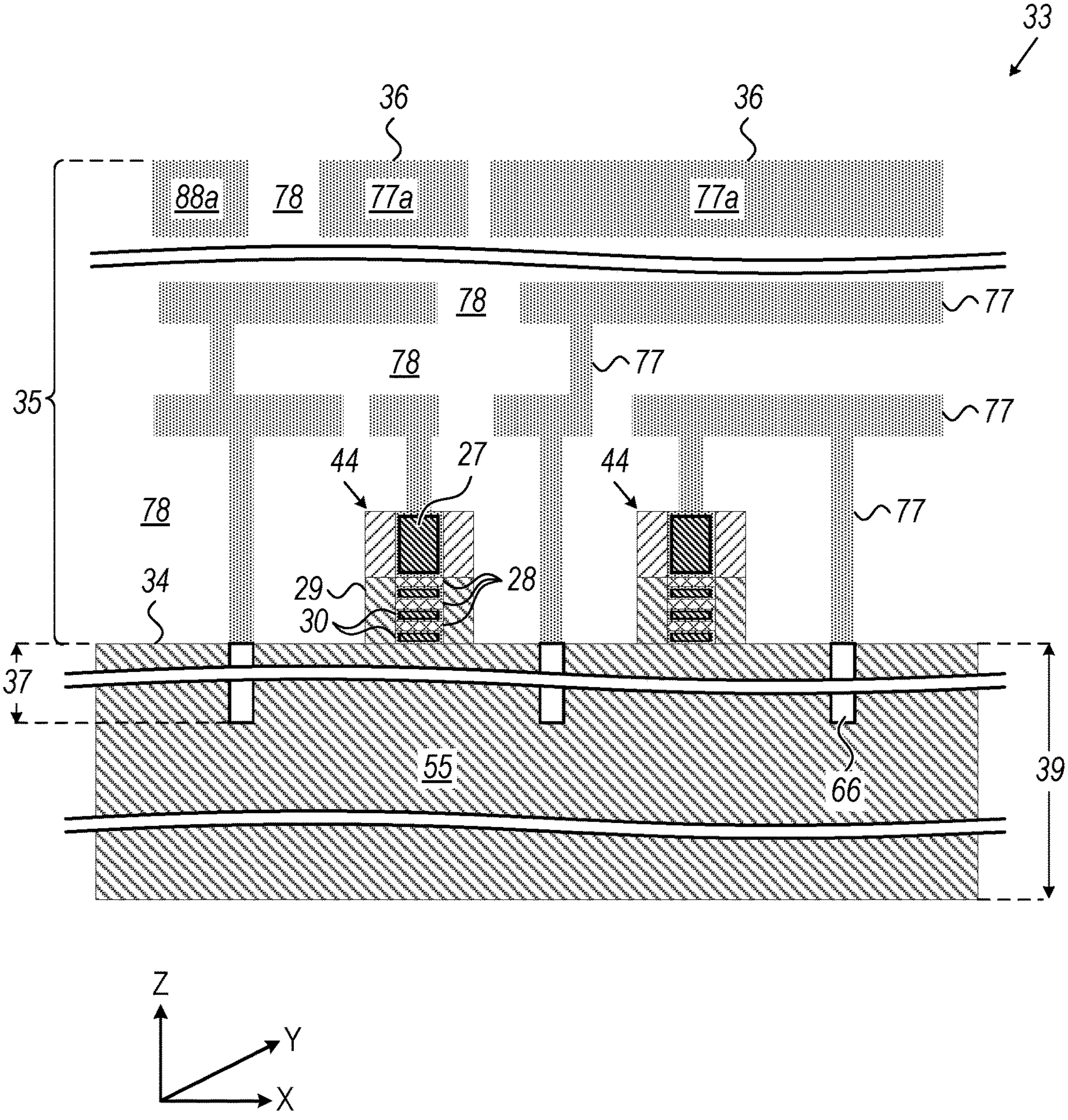
FIGS. 2A and 2B are schematic, sectional views of a process sequence for fabricating the electronic device of FIG. 1, in accordance with embodiments that are described herein.
Figure 2B:
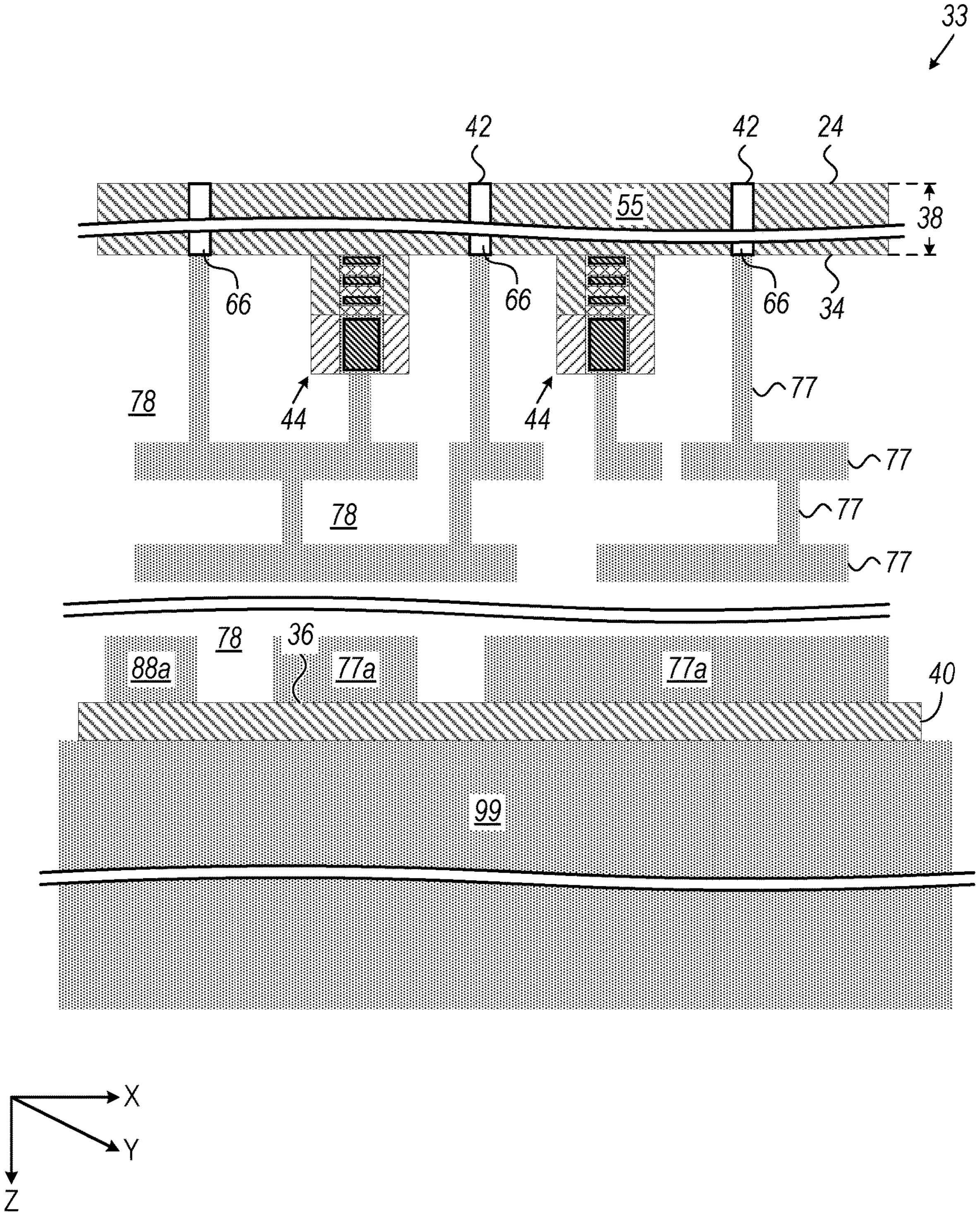

FIGS. 2A and 2B are schematic, sectional views of a process sequence for fabricating electronic device 11, in accordance with embodiments that are described herein.

Reference is now made to FIG. 2A that illustrates the fabrication of semiconductor device 33. In the present example, the fabrication of semiconductor device 33 comprises the formation of at least: (i) GAA FETs 44 on surface 34 of substrate 55 whose fabrication is described in more detail below, (ii) dielectric layers 78, and power supply structure 88*a*, (iii) ECs 77, which are the interconnects of device 33 and are patterned within and between dielectric layers 78, and (iv) ISVs 66 that may be fabricated together with semiconductor device 33, as will be depicted herein. Alternatively, ISVs 66 may be fabricated at a later stage as will be depicted in FIG. 2B below.

In some embodiments, GAA FETs 44 may be fabricated using any suitable process sequence known in the art. In the present example, a stack of six layers comprising three pairs of alternating first and second layers, which are disposed and patterned on surface 34 of substrate 55. The first layers comprise epitaxially grown sacrificial layers (and therefore are not shown), e.g., made from silicon-germanium (SiGe), and the second layers comprise nanosheets 28 made from single crystalline silicon or graphene. As such, the first SiGe layer is disposed directly on surface 34, the first single crystalline layer is disposed over the first SiGe layer, and the remaining four layers are disposed alternately using the same order. Subsequently, a dummy gate (not shown, e.g., made from polycrystalline silicon) is formed and patterned over the stack described above. The exposed sides of the SiGe sacrificial layers are etched, followed by deposition, or growing of inner spacers (not shown, e.g., made from silicon-nitride, $Si_3N_4$). In other embodiments, the stack of GAA FETs 44 may be fabricated using any other suitable process sequence known in the art.

In some embodiments, source and drain (SD) 29 are formed at the sides of stack described above, e.g., by selectively growing or depositing a few nanometers of SiGe or any other suitable materials. Subsequently, a hard mask (not shown, e.g., made from silicone-nitride or a suitable low-K material) is formed over SD 29, and subsequently, the dummy gate and the SiGe sacrificial layers (both described above) are selectively removed using a suitable high-selectivity wet etching process. Finally, the fabrication of GAA FET 44 is concluded by: (i) fabricating gate 27 by growing or depositing silicon dioxide ($SiO_2$), high-K and several metal layers (e.g., hafnium oxide, titanium nitride, titanium aluminum, and tungsten, and (ii) one or more layers 30 configured to serve as the high-k metal gate surrounding nanosheets 28.

The process sequence for fabricating GAA FETs 44 is simplified and provided by way of example. In other embodiments, GAA FETs 44 may be fabricated using any other suitable fabrication technique.

In some embodiments, the deposition of a least some of the aforementioned layers is typically carried out using atomic layer deposition (ALD) and/or plasma enhanced chemical vapor deposition (PECVD) systems, such as the Producer family of products supplied by Applied Materials (3050 Bowers Avenue P.O. Box 58039. Santa Clara, CA 95054-3299), or the VECTOR® family of products supplied by Lam Research (44036 S. Grimmer Blvd. Fremont, CA 94538).

Moreover, the patterning of the structures of GAA FET 44 is carried out using one or both of (i) a self-aligned patterning process described below, and (ii) a photolithography system, such as the NXE family of extreme ultraviolet (EUV) products supplied by ASML (De Run 6501 5504 DR, Veldhoven, The Netherlands), or using a suitable immersion lithography system having a wavelength of 193 nm, such as the NXT family of products supplied by (i) ASML, (ii) Nikon Inc. (1399 Shoreway Road, Belmont, CA 94002-4107), and (iii) Canon semiconductor equipment Inc. (3577, Yoshiwara, Ohaza, Ami-urachi, Inashiki-gun, Ibaraki 300-1195, Japan).

In some embodiments, the self-aligned patterning process enables substantial miniaturization of structures of GAA FET 44. For example the sequence of the self-aligned patterning process may comprise: (i) disposing on substrate 55 at least a semiconductor layer and a stack of dielectric layers, (ii) patterning a mandrel mask in at least one of the dielectric layers of the stack (using photolithography and etching processes), (iii) patterning a spacer at sidewalls of the mandrel mask and removing the mandrel mask (using an etching process), and (iv) patterning the structure of interest in the semiconductor layer by transferring a pattern of the spacer to the semiconductor layer (using an additional etching process).

In some embodiments, the etching processes described above may comprise reactive ion etching (RIE) processes using RIE systems, such as the Applied Materials Centura™ Dielectric Etcher and/or Lam Research Atomic Layer Etcher or Selective Etcher provided applied materials and/or Lam Research, respectively. Additionally, or alternatively, at least one of the RIE processes may be carried out using an Episode™ UL system, or a Tactras™ system, supplied by Tokyo Electron Ltd (Akasaka Biz Tower 3-1 Akasaka 5-chome, Minato-ku, Tokyo 107-6325, Japan)

In some embodiments, after concluding the formation of GAA FETs 44, ISVs 66 are formed by etching holes into substrate 55. The holes may have a depth 37 between about 100 nm and 500 nm, and a diameter of about 100 nm (or any other suitable depth and diameter). It is noted that the depth of ISVs 66, and the diameter of each ISV 66 are determined based on the application requirements of device 11. Subsequently, the etched holes are filled with one or more electrically conductive layers, such as copper. Subsequently, dielectric layers 78 and the copper interconnects of ECs 77 are formed and stacked alternately, e.g., along the Z-axis of side 35, and in the XY planes located between surfaces 34 and 36 as depicted in FIG. 1 above. The number of levels of the copper interconnect layers (EC 77) is typically over ten (e.g., between about 15 levels and 25 levels) but may be less, depending on the technology node and the application requirements of semiconductor device 33. It is noted that the copper vias of ECs 77 are formed along the Z-axis (i) between each pair of the copper interconnect layers, as described in FIG. 1 above, and (ii) between copper interconnects and gate 27, as shown for example in FIGS. 1 and 2A.

In some embodiments, power supply structure 88*a* is implemented within ECs 77, and therefore, is typically fabricated along with outer layer 77*a* of ECs 77. It is noted that while fabricating semiconductor device 33, substrate 55 has a thickness 39, which depends on the diameter and the material of substrate 55. For example, in silicon wafers having a diameter of about 300 mm, and about 450 mm, the size of thickness 39 is approximately 0.775 mm and 0.925 mm, respectively. As such, it is noted that at the stage shown in FIG. 2A, one edge of ISVs 66 is buried within substrate 55.

Reference is now made to FIG. 2B that illustrates operations carried out after concluding the fabrication of semiconductor device 33. It is noted that semiconductor device 33 is flipped upside-down in the example of FIG. 2B, and therefore the XYZ coordinate system appears upside-down compared to that of FIGS. 1 and 2B above.

In some embodiments, passivation layer 40 (e.g., made for $Si_3N_4$) is formed on surface 36 of layer 77*a*. Subsequently passivation layer 40 is coupled (typically bonded) to a carrier substrate, referred to herein as a carrier 99. In the present example, carrier 99 is made from a suitable silicon wafer, or using any other suitable carrier substrate. In some embodiments, passivation layer 40 is configured to protect semiconductor device 33 from a mechanical damage and/or contamination, while being bonded to carrier 99, as well as during subsequent process operations described herein.

In some embodiments, the thickness 39 of substrate 55 is reduced from (i) between about 0.775 mm and 0.925 mm, as described in FIG. 2A above, to thickness 38, which is (ii) between about 100 nm and 500 nm. It is noted that thickness 38 corresponds to depth 37 of ISVs 66, so as to expose both ends of each ISV 66 as will be depicted below. In the present example, the substantial thinning of substrate 55 is carried out using an etching process and/or a chemical mechanical polishing (CMP) process. In such embodiments, a surface 42 of ISVs 66 is flush with surface 24 of substrate 55, and thereby, surface 42 is exposed out of substrate 55.

In some embodiments, after concluding the thinning of substrate 55 and exposing surface 42, semiconductor device 22 is being fabricated on surface 24 of substrate 55, using the technique for fabricating semiconductor device 33 (with necessary changes), as depicted in FIG. 2A above. It is noted that carrier 99 is bonded to passivation layer 40 in order to compensate for the stiffness of semiconductor device 33, which has been substantially reduced after thinning substrate 55 to thickness 38. The stiffness is required for withstanding mechanical forces associated with the handling of electronic device 11, which are applied to electronic device 11 while fabricating semiconductor device 22.

In some embodiments, after concluding the fabrication of semiconductor device 22, carrier 99 is removed, and if needed, passivation layer 40 may also be removed to obtain the structure of electronic device 11 shown in FIG. 1 above.

In other embodiments, ISVs 66 may be fabricated concurrently with the fabrication of semiconductor device 22. In such embodiments, after thinning substrate to thickness 38, the hole of ISV may be formed by etching through substrate 55, and subsequently, the hole is filled with the copper, as described in FIGS. 1 and 2A above.

Figure 3:
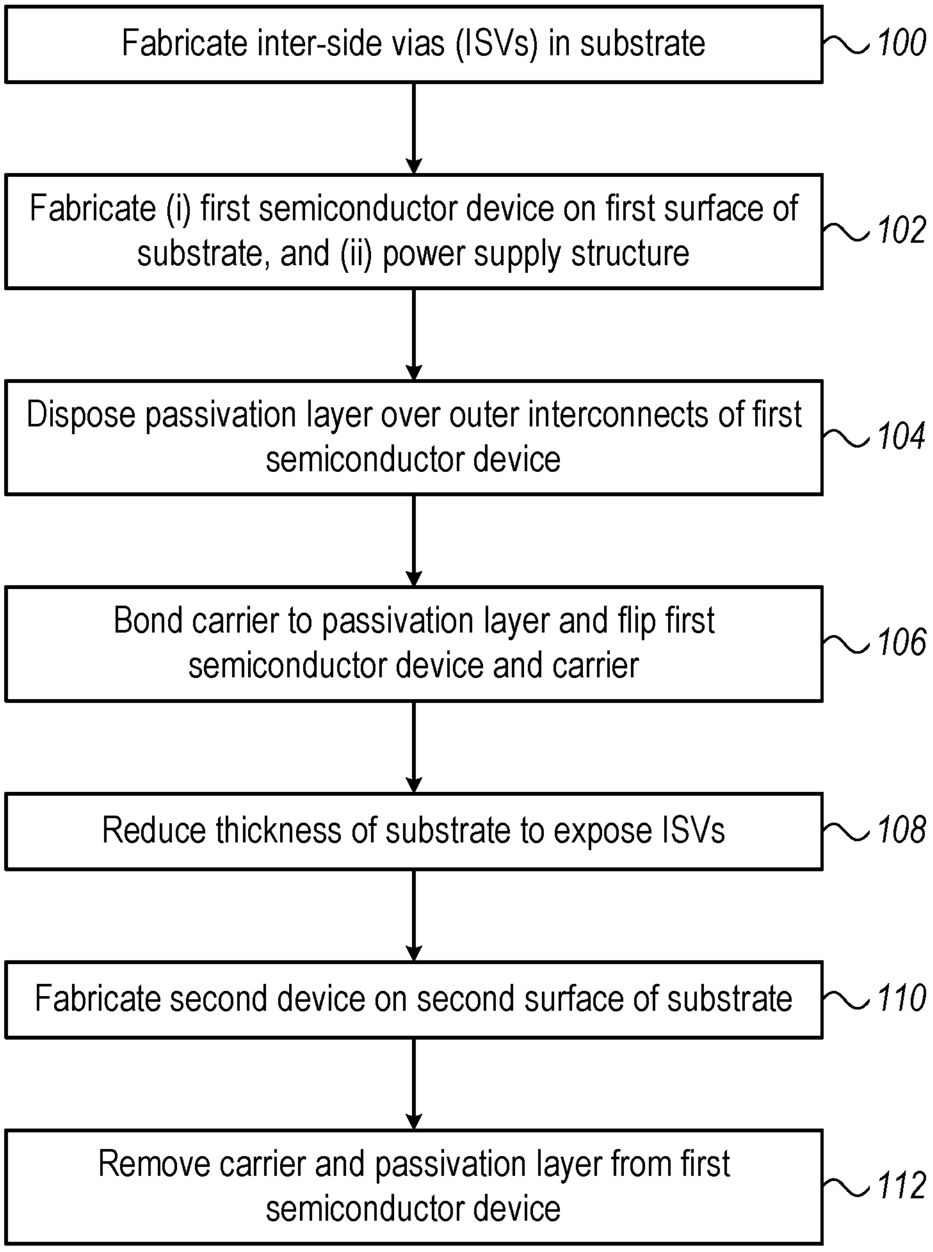
FIG. 3 is a flow chart that schematically illustrates a method for fabricating the electronic device of FIG. 1, in accordance with an embodiment that is described herein.

FIG. 3 is a flow chart that schematically illustrates a method for fabricating electronic device 11, in accordance with an embodiment that is described herein.

The method begins at an inter-side via (ISV) fabrication operation 100 with the fabrication of ISVs 66 by etching holes in substrate 55, and optionally, filling the holes with copper interconnects, as depicted in detail in FIG. 2A above.

At a first device fabrication operation 102, semiconductor device 33 that comprises ECs 77 and optionally layer 77*a*, and power supply structure 88*a* are formed on surface 34 of substrate 55, as described in detail in FIG. 2A above. It is noted that the filling of the holes of ISVs 66 with copper may be carried out either (i) before the fabrication of GAA FETs 44, or (ii) during the fabrication of ECs 77 that is carried out after the fabrication of GAA FETs 44.

At a passivation formation operation 104, passivation layer 40 is formed over surface 36 of layer 77*a*, as depicted in FIG. 2B above.

At a carrier bonding operation 106, carrier 99 is bonded to passivation layer 40, as depicted in FIG. 2B above. Moreover, the stack comprising (i) substrate 55, (ii) semiconductor device 33, (iii) passivation layer 40, and (iv) carrier 99, is flipped in order to prepare substrate 55 for the fabrication process of semiconductor device 22, as depicted in FIG. 2B above.

At a substrate thinning operation 108, substrate 55 is thinned, e.g., from about 0.925 mm to about 200 nm, as described in detail in FIG. 2B above.

At a second device fabrication operation 110, semiconductor device 22 is formed on surface 24 of substrate 55 using the same techniques for fabricating semiconductor device 33, as described in detail in FIG. 2A above. As such, semiconductor device 33 comprises ECs 77 and optionally layer 77*b*. In other embodiments, the fabrication of ISVs 66 may be carried out before or during operation 110, e.g., instead of fabricating ISVs 66 in one or both of operations 100 and 102 above.

At a carrier removal operation 112 that concludes the method, carrier 99 and passivation layer 40 are removed from surface 36 of semiconductor device 33, as depicted in FIG. 2B above. Note that the removal of carrier 99 and passivation layer 40 obtains the configuration of device 11 shown in FIG. 1 above.

In some embodiments, a typical process for fabricating electronic device 11, and particularly semiconductor devices 22 and 33, comprises at least several hundred (and optionally over one thousand) operations. Thus, it is noted that the method described in FIG. 3 is simplified, with many operations and sub-operations being omitted for the sake of conceptual clarity.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An electronic device, comprising:
- a substrate;
- a first semiconductor device comprising a first plurality of gate all-around (GAA) field effect transistors (FETs) formed over a first side of the substrate;
- a second semiconductor device comprising a second plurality of GAA FETs formed over a second side of the substrate, opposite the first side; and
- a power supply structure disposed at the first side, the power supply structure configured to supply power to one or more of: (i) the first plurality of GAA FETs through first electrical couplings disposed at the first side, and (ii) the second plurality of GAA FETs through second electrical couplings comprising one or more inter-side vias (ISVs) traversing the substrate from the second side to the first side, wherein the first electrical couplings comprise a first plurality of metal traces and a first plurality of vias, the first plurality of vias being orthogonal to a first surface of the substrate and configured to electrically couple between different layers of the first plurality of metal traces, the first plurality of vias further comprising a first via connecting a given ISV among the ISVs to a first metal trace among the first plurality of metal traces, the first via being connected to the given ISV at the first surface, and wherein the second electrical couplings comprise a second plurality of metal traces and a second plurality of vias, the second plurality of vias being orthogonal to a second surface of the substrate and configured to electrically couple between different layers of the second plurality of metal traces, the second plurality of vias further comprising a second via connecting the given ISV to a second metal trace among the second plurality of metal traces, the second via being connected to the given ISV at the second surface.

2. The electronic device according to claim 1, wherein at least the given ISV among the ISVs comprises an electrically conductive interconnect, the electrically conductive interconnect being formed within the given ISV and being configured to conduct an electrical signal between the first and second semiconductor devices.

3. The electronic device according to claim 2, wherein at least one of the power supply structure, the first semiconductor device, and the second semiconductor device is configured to conduct, through the given ISV, at least one of: (i) a data signal, (ii) a power signal, and (iii) a ground signal.

4. The electronic device according to claim 1, further comprising an additional power supply structure disposed at the second side, the additional power supply structure being configured to supply power to one or more of: (i) the second plurality of GAA FETs through the second electrical couplings disposed at the second side, and (ii) the first plurality of GAA FETs through the first electrical couplings and at least the one or more ISVs of the second electrical couplings.

5. The electronic device according to claim 1, wherein the first semiconductor device comprises a first type of semiconductor device, and the second semiconductor device comprises a second type of semiconductor device.

6. The electronic device according to claim 5, wherein the first and second types of semiconductor devices comprise a same type of semiconductor device.

7. The electronic device according to claim 5, wherein the first and second types of semiconductor devices comprise different types of semiconductor devices.

8. The electronic device according to claim 1, wherein the substrate comprises a non-conductive substrate.

9. The electronic device according to claim 8, wherein the non-conductive substrate comprises a ceramic substrate.

10. The electronic device according to claim 8, wherein the non-conductive substrate comprises a polymer substrate.

11. A method for fabricating an electronic device, the method comprising:

forming, on a first side of a substrate, a first semiconductor device comprising a first plurality of gate all-around (GAA) field effect transistors (FETs);

forming, on a second side of the substrate that is opposite the first side, a second semiconductor device comprising a second plurality of GAA FETs; and disposing at the first side, a power supply structure for supplying power to one or more of: (i) the first plurality of GAA FETs through first electrical couplings disposed at the first side, and (ii) the second plurality of GAA FETs through second electrical couplings comprising one or more inter-side vias (ISVs) traversing the substrate from the second side to the first side, wherein the first electrical couplings comprise a first plurality of metal traces and a first plurality of vias, the first plurality of vias being orthogonal to a first surface of the substrate and configured to electrically couple between different layers of the first plurality of metal traces, the first plurality of vias further comprising a first via connecting a given ISV among the ISVs to a first metal trace among the first plurality of metal traces, the first via being connected to the given ISV at the first surface, and wherein the second electrical couplings comprise a second plurality of metal traces and a second plurality of vias, the second plurality of vias being orthogonal to a second surface of the substrate and configured to electrically couple between different layers of the second plurality of metal traces, the second plurality of vias further comprising a second via connecting the given ISV to a second metal trace among the second plurality of metal traces, the second via being connected to the given ISV at the second surface.

12. The method according to claim 11, further comprising forming within at least the given ISV among the ISVs, an electrically conductive interconnect for conducting an electrical signal between the first and second semiconductor devices.

13. The method according to claim 12, wherein forming the electrically conductive interconnect is for conducting, from at least one of the power supply structure, the first semiconductor device and the second semiconductor device, and through the given ISV, at least one of: (i) a data signal, (ii) a power signal, and (iii) a ground signal.

14. The method according to claim 11, further comprising disposing at the second side, an additional power supply structure for supplying power to one or more of: (i) the second plurality of GAA FETS through the second electrical couplings disposed at the second side, and (ii) the first plurality of GAA FETs through the first electrical couplings and at least the one or more ISVs of the second electrical couplings.

15. The method according to claim 11, wherein forming the first semiconductor device comprises forming a first type of semiconductor device, and forming the second semiconductor device comprises forming a second type of semiconductor device.

16. The method according to claim 15, wherein forming the first and second types of semiconductor devices comprises forming a same type of semiconductor device.

17. The method according to claim 15, wherein forming the first and second types of semiconductor devices comprises forming different types of semiconductor devices.

18. The method according to claim 11, wherein forming the semiconductor devices on the substrate comprises forming the semiconductor devices on a non-conductive substrate.

19. The method according to claim 18, wherein forming the semiconductor devices on the non-conductive substrate comprises forming the semiconductor devices on a ceramic substrate.

20. The method according to claim 18, wherein forming the semiconductor devices on the non-conductive substrate comprises forming the semiconductor devices on a polymer substrate.

* * * * *